(12) United States Patent
Wang

(10) Patent No.: US 10,510,558 B2
(45) Date of Patent: Dec. 17, 2019

(54) ELECTRONIC DEVICE, THIN FILM TRANSISTOR, ARRAY SUBSTRATE AND MANUFACTURING METHOD THEREOF

(71) Applicant: BOE TECHNOLOGY GROUP CO., LTD., Beijing (CN)

(72) Inventor: Meili Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 15/553,695

(22) PCT Filed: Feb. 10, 2017

(86) PCT No.: PCT/CN2017/073228
§ 371 (c)(1),
(2) Date: Aug. 25, 2017

(87) PCT Pub. No.: WO2017/202057
PCT Pub. Date: Nov. 30, 2017

(65) Prior Publication Data
US 2018/0174863 A1    Jun. 21, 2018

(30) Foreign Application Priority Data
May 27, 2016  (CN) .......................... 2016 1 0365811

(51) Int. Cl.
*H01L 21/48*     (2006.01)
*H01L 21/02*     (2006.01)
(Continued)

(52) U.S. Cl.
CPC .... *H01L 21/4871* (2013.01); *H01L 21/02518* (2013.01); *H01L 21/223* (2013.01);
(Continued)

(58) Field of Classification Search
CPC ........... H01L 21/4871; H01L 21/02518; H01L 21/223; H05K 1/09; H05K 3/0011; H05K 3/067
(Continued)

(56) References Cited

U.S. PATENT DOCUMENTS 8,636,845 B2     1/2014  Gatineau et al.
2001/0054765 A1  12/2001 Ohto et al.
(Continued)

FOREIGN PATENT DOCUMENTS

CN     102122634 A     7/2011
CN     103094184 A     5/2013
(Continued)

OTHER PUBLICATIONS

International Search Report of PCT/CN2017/073228 in Chinese, dated May 10, 2017 with English translation.
(Continued)

*Primary Examiner* — Tremesha S Willis
(74) *Attorney, Agent, or Firm* — Collard & Roe, P.C.

(57) ABSTRACT

Disclosed are an electronic device and the manufacturing method thereof, a manufacturing method of a thin film transistor, and an array substrate and manufacturing method thereof. The manufacturing method of an electronic device includes: forming a metallic structure on a base substrate; forming an oxygen-free insulating layer on the metallic structure and the base substrate; and forming an insulating protective layer on the oxygen-free insulating layer. The manufacturing method of the electronic device protects a metallic structure by forming an oxygen-free insulating layer, not containing oxygen elements, on the metallic structure, and hence prevents the metallic structure from being oxidized.

14 Claims, 3 Drawing Sheets

(51) Int. Cl.
 H01L 21/223 (2006.01)
 H05K 1/09 (2006.01)
 H05K 3/00 (2006.01)
 H05K 3/06 (2006.01)
(52) U.S. Cl.
 CPC ............ *H05K 1/09* (2013.01); *H05K 3/0011* (2013.01); *H05K 3/067* (2013.01)
(58) Field of Classification Search
 USPC ........................................................ 174/258
 See application file for complete search history.

(56) References Cited

U.S. PATENT DOCUMENTS

| | | | |
|---|---|---|---|
| 2011/0263117 A1 | 10/2011 | Nam et al. | |
| 2012/0248633 A1* | 10/2012 | Fukuda | H01L 51/003 257/787 |
| 2015/0084043 A1* | 3/2015 | Ishihara | H01L 27/1225 257/43 |
| 2016/0120022 A1* | 4/2016 | Lee | G06F 1/1652 361/749 |

FOREIGN PATENT DOCUMENTS

| | | |
|---|---|---|
| CN | 104217990 A | 12/2014 |
| CN | 105914134 A | 8/2016 |

OTHER PUBLICATIONS

Notice of Transmittal of the International Search Report of PCT/CN2017/073228 in Chinese, dated May 10, 2017.
Written Opinion of the International Searching Authority of PCT/CN2017/073228 in Chinese, dated May 10, 2017 with English translation.
Chinese Office Action in Chinese Application No. 201610365811.0, dated Dec. 5, 2016 with English translation.
Chinese Search Report in CN 201610365811.0 dated Oct. 7, 2016 with English translation.

* cited by examiner

US 10,510,558 B2

ELECTRONIC DEVICE, THIN FILM TRANSISTOR, ARRAY SUBSTRATE AND MANUFACTURING METHOD THEREOF

CROSS REFERENCE TO RELATED APPLICATIONS

This application is the National Stage of PCT/CN2017/073228 filed on Feb. 10, 2017, which claims priority under 35 U.S.C. § 119 of Chinese Application No. 201610365811.0 filed on May 27, 2016, the disclosure of which is incorporated by reference.

TECHNICAL FIELD

Embodiments of the present disclosure relate to an electronic device and a manufacturing method thereof, a manufacturing method of a thin film transistor, an array substrate and a manufacturing method thereof.

BACKGROUND

Thin film transistor (TFT) is a switching element commonly used in the display field. A TFT generally includes a gate electrode, a gate insulating layer, an active layer and a source electrode and a drain electrode electrically connected with the active layer, wherein the active layer is usually made from semiconductor materials such as polycrystalline silicon (poly-Si), monocrystalline silicon (mono-Si) and oxide semiconductor. The TFTs may be divided into top-gate TFTs and bottom-gate TFTs according to the relative positional relationship between the gate electrode and the active layer of the TFT.

An array substrate is an important component of a display device. The array substrate generally comprises display regions and non-display regions. A plurality of TFTs arranged in a matrix are generally disposed in the display regions. Each TFT may be configured to control the display state of at least one pixel unit in the display region of the array substrate.

SUMMARY

At least one embodiment of the present disclosure provides an electronic device and manufacturing method thereof, a manufacturing method of a thin film transistor, an array substrate and manufacturing method thereof. The manufacturing method of an electronic device forms an oxygen-free insulating layer which does not include oxygen element on a metallic structure, so as to protect the metallic structure, and prevent the metallic structure being oxidized.

At least one embodiment of the present disclosure provides a manufacturing method of an electronic device, comprising: forming a metallic structure on a base substrate; forming an oxygen-free insulating layer on the metallic structure and the base substrate; and forming an insulating protective layer on the oxygen-free insulating layer.

For example, in the manufacturing method of the electronic device provided by an embodiment of the present disclosure, the oxygen-free insulating layer is made from silane; and the manufacturing method of the electronic device further comprises: forming a semiconductor layer below the metallic structure; and changing a part of the semiconductor layer making contact with the oxygen-free insulating layer into conductor by hydrogen released from the silane in the process of forming the oxygen-free insulating layer.

For example, in the manufacturing method of the electronic device provided by an embodiment of the present disclosure, the manufacturing method of the electronic device further comprises: forming a conductive structure on the insulating protective layer, wherein the conductive structure and the metallic structure have an overlapped part; and the dielectric constant of the oxygen-free insulating layer is less than or equal to 6.

For example, in the manufacturing method of the electronic device provided by an embodiment of the present disclosure, the manufacturing method of the electronic device further comprises: forming through holes in the oxygen-free insulating layer and the insulating protective layer, wherein the through holes are used for exposing the metallic structure; the insulating protective layer is etched by oxygen etching process; and the oxygen-free insulating layer is etched by oxygen-free etching process, so as to form the through holes.

For example, in the manufacturing method of the electronic device provided by an embodiment of the present disclosure, under the oxygen-free etching process, an etching rate of the oxygen-free insulating layer is larger than that of the insulating protective layer.

For example, in the manufacturing method of the electronic device provided by an embodiment of the present disclosure, the metallic structure includes at least one of a gate electrode, a gate line, a data line, a source electrode, a drain electrode, a common electrode line or a common electrode; and the insulating protective layer includes at least one of an interlayer dielectric layer or a passivation layer.

For example, in the manufacturing method of the electronic device provided by an embodiment of the present disclosure, the metallic structure has a material including copper; and the manufacturing method of the electronic device further comprises: forming a diffusion barrier layer beneath the metallic structure.

For example, in the manufacturing method of the electronic device provided by an embodiment of the present disclosure, the oxygen-free insulating layer has a material including SiNC or SiNF.

For example, in the manufacturing method of the electronic device provided by an embodiment of the present disclosure, a thickness of the oxygen-free insulating layer is less than that of the insulating protective layer.

At least one embodiment of the present disclosure further provides a manufacturing method of a thin film transistor (TFT), comprising: forming an active layer on a base substrate, wherein the active layer includes a source area, a drain area and a channel area disposed between the source area and the drain area; forming a gate insulating layer on the channel area; forming a gate electrode on the gate insulating layer; forming a first oxygen-free insulating layer on the gate electrode and the active layer; and forming an interlayer dielectric layer on the first oxygen-free insulating layer.

For example, in the manufacturing method of the thin film transistor provided by an embodiment of the present disclosure, the first oxygen-free insulating layer is made from silane; and the manufacturing method of the thin film transistor further comprises: changing the source area and the drain area of the active layer into conductor by hydrogen released by the silane in the process of forming the first oxygen-free insulating layer.

For example, in the manufacturing method of the thin film transistor provided by an embodiment of the present disclosure, further comprising: forming first through holes for respectively exposing the source area and the drain area in the interlayer dielectric layer and the first oxygen-free insulating layer; forming a source electrode and a drain electrode on the interlayer dielectric layer, wherein the source electrode and the drain electrode are respectively electrically connected with the source area and the drain area via the first through holes; forming a second oxygen-free insulating layer on the source electrode and the drain electrode; and forming a passivation layer on the second oxygen-free insulating layer.

For example, in the manufacturing method of the thin film transistor provided by an embodiment of the present disclosure, further comprising: forming a second through hole for exposing the drain electrode in the second oxygen-free insulating layer and the passivation layer, wherein the passivation layer is etched by oxygen etching process; and the second oxygen-free insulating layer is etched by oxygen-free etching process.

For example, in the manufacturing method of the thin film transistor provided by an embodiment of the present disclosure, under the oxygen-free etching process, an etching rate of the second oxygen-free insulating layer is larger than that of the passivation layer.

For example, in the manufacturing method of the thin film transistor provided by an embodiment of the present disclosure, at least one of the gate electrode, the source electrode or the drain electrode include copper.

For example, in the manufacturing method of the thin film transistor provided by an embodiment of the present disclosure, the first oxygen-free insulating layer or the second oxygen-free insulating layer has a material including SiNC or SiNF.

For example, in the manufacturing method of the thin film transistor provided by an embodiment of the present disclosure, the first oxygen-free insulating layer has a material the same with that of the second oxygen-free insulating layer.

At least one embodiment of the present disclosure further provides a manufacturing method of an array substrate, comprising forming a thin film transistor, wherein the thin film transistor are manufactured by any one of the abovementioned methods.

For example, in the manufacturing method of the array substrate provided by an embodiment of the present disclosure, further comprising: forming a gate line and a data line on the base substrate, wherein the gate line and the gate electrode are arranged in a same layer; the data line and the source electrode and the drain electrode are arranged in a same layer; the gate line and the data line have an overlapped part; and the dielectric constant of the first oxygen-free insulating layer is less than or equal to 6.

At least one embodiment of the present disclosure further provides an electronic device, comprising: a base substrate; a metallic structure disposed on the base substrate; an oxygen-free insulating layer disposed on the metallic structure; and an insulating protective layer disposed on the oxygen-free insulating layer.

For example, in the electronic device provided by an embodiment of the present disclosure, the oxygen-free insulating layer makes direct contact with the metallic structure.

For example, in the electronic device provided by an embodiment of the present disclosure, further comprising: a conductive structure disposed on the insulating protective layer, wherein the conductive structure and the metallic structure have an overlapped part; and the dielectric constant of the oxygen-free insulating layer is less than or equal to 6.

For example, in the electronic device provided by an embodiment of the present disclosure, the metallic structure has a material including copper; and the electronic device further comprises a diffusion barrier layer disposed beneath the metallic structure.

At least one embodiment of the present disclosure further provides an array substrate, comprising any one of the abovementioned electronic devices.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention, not limitative to the present disclosure.

DETAILED DESCRIPTION

Figure 1:
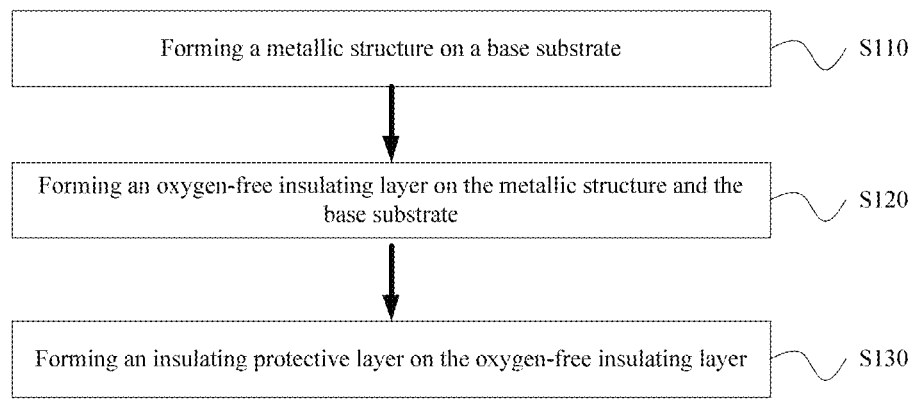
FIG. 1 is a flow diagram of a manufacturing method of an electronic device, provided by one embodiment of the present disclosure.

In order to make objects, technical details and advantages of the embodiments of the present disclosure apparent, the technical solutions of the embodiment will be described in a clearly and fully understandable way in connection with the drawings related to the embodiments of the present disclosure. It is obvious that the described embodiments are just a part but not all of the embodiments of the disclosure. Based on the described embodiments herein, one person skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," and so on which are used in the description and the claims of the present application for invention, are not intended to indicate any sequence, amount or importance, but distinguish various components. The terms "includes," "comprising," "includes," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly.

The inventor(s) of the application notice in the study that: along with the increased size of a display device, the signal delay effect is more obvious, and then the display quality is reduced. Therefore, the signal delay can be reduced by adoption of metals with low resistivity such as copper as electrodes, so that the display quality can be improved. However, in order to ensure good TFT characteristics and stability of TFTs, an overcoat layer of gate electrodes and source/drain electrodes require a high deposition temperature; but along with the rise of the deposition temperature of the overcoat layer of the gate electrodes and the source/drain electrodes, the electrodes with low resistivity such as copper electrodes will be subjected to serious oxidation, so that the TFT characteristics can be affected.

Embodiments of the present disclosure provide an electronic device and a manufacturing method thereof, a manufacturing method of a thin film transistor, an array substrate and a manufacturing method thereof. The manufacturing method of the electronic device protects a metallic structure by forming an oxygen-free insulating layer, not containing oxygen elements, on the metallic structure, and hence prevents the metallic structure from being oxidized.

Hereinafter, the electronic device and the manufacturing method thereof, the manufacturing method of a thin film transistor, the array substrate and the manufacturing method thereof provided by the embodiments of the present disclosure will be illustrated in conjunction with the accompanying drawings.

First Embodiment

Figure 2:
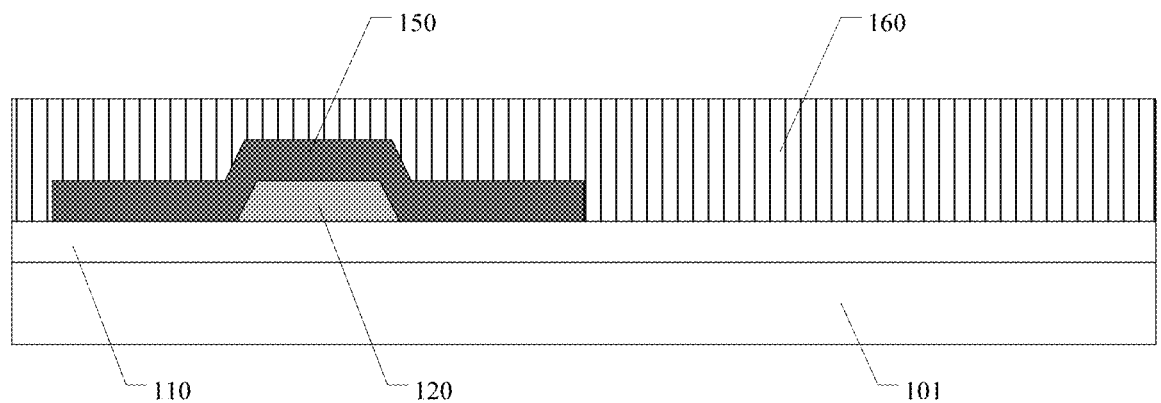
FIG. 2 is a schematic structural diagram of an electronic device provided by one embodiment of the present disclosure.

The present embodiment provides a manufacturing method of an electronic device, which, as shown in FIG. 1, comprises the following steps S110-S130:

S110: as shown in FIG. 2, forming a metallic structure 120 on a base substrate 101.

For example, the base substrate 101 may be a glass substrate, a quartz substrate, a resin substrate or other substrates.

For example, the metallic structure 120 may be any single layer or a superimposed layer of chromium, molybdenum, aluminum, copper, aluminum, aluminum alloy, copper and copper alloy.

S120: as shown in FIG. 2, forming an oxygen-free insulating layer 150 on the metallic structure 120 and the base substrate 101.

S130: as shown in FIG. 2, forming an insulating protective layer 160 on the oxygen-free insulating layer 150.

For example, the insulating protective layer 160 may be made from inorganic insulating materials such as SiO and SiNO or organic insulating materials such as polymethyl methacrylate (PMMA) and polyimide.

In the manufacturing method of the electronic device provided by the embodiment, as the oxygen-free insulating layer 150 is formed on the metallic structure 120, the metallic structure 120 may be protected in the process of forming the insulating protective layer 160, so as to prevent the metallic structure 120 from being oxidized. Moreover, due to the protection of the oxygen-free insulating layer 150, the insulating protective layer 160 may be formed by a high deposition temperature, so that the electrical properties and the stability of the electronic device manufactured by the manufacturing method of the electronic device, provided by the embodiment, can be improved. In addition, as the oxygen-free insulating layer 150 does not contain oxygen elements, in the long-term use process of the electronic device manufactured by the manufacturing method of the electronic device provided by the embodiment, no oxygen element in the oxygen-free insulating layer 150 is penetrated into the metallic structure 120, so that the metallic structure 120 can be prevented from being oxidized, and hence the stability of the electronic device can be further improved.

For example, in the manufacturing method of the electronic device provided by one example of the embodiment, as shown in FIG. 2, the material of the metallic structure 120 include copper; and the manufacturing method of the electronic device further comprises the step of forming a diffusion barrier layer 110 beneath the metallic structure 120. As copper has small resistivity, the adoption of copper as the materials of the metallic structure 120 can reduce signal delay and hence improve the display quality. In a large-size display device, the effect is more obvious. Of course, the present embodiment includes but is not limited thereto. The material of the metallic structure 120 may also include other conductive material. In addition, the diffusion barrier layer 110 formed beneath the metallic structure 120 can prevent copper elements of the metallic structure 120 from being diffused to other layers.

Figure 3:
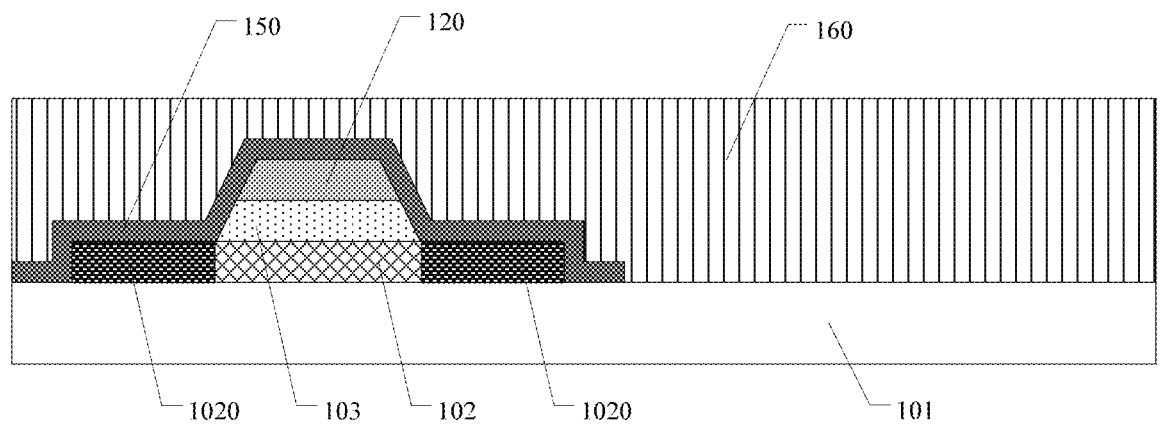
FIG. 3 is a schematic structural diagram of another electronic device provided by one embodiment of the present disclosure.

For example, in the manufacturing method of the electronic device, provided by one example of the embodiment, the oxygen-free insulating layer 150 is made from silane; and the manufacturing method of the electronic device further comprises: as shown in FIG. 3, forming a semiconductor layer 102 below the metallic structure 120; changing a part of the semiconductor layer 102 making contact with the oxygen-free insulating layer 150 into conductor by hydrogen released from the silane in the process of forming the oxygen-free insulating layer 150. It should be noted that the semiconductor layer 102 includes a part making contact with the oxygen-free insulating layer 150, and the silane releases the hydrogen to change the part of the semiconductor layer 102 making contact with the oxygen-free insulating layer 150 into conductor.

For example, as shown in FIG. 3, an insulating layer 103 is also formed between the semiconductor layer 102 and the metallic structure 120. The semiconductor layer 102 and the metallic structure 120 may be insulated from each other through the insulating layer 103.

In the manufacturing method of the electronic device provided by the embodiment of the present disclosure, upon the oxygen-free insulating layer 150 being made from silane, a part of the semiconductor layer 102 making contact with the oxygen-free insulating layer 150 may be changed into a conductor, so that the steps can be simplified and the cost can be reduced.

Figure 4:
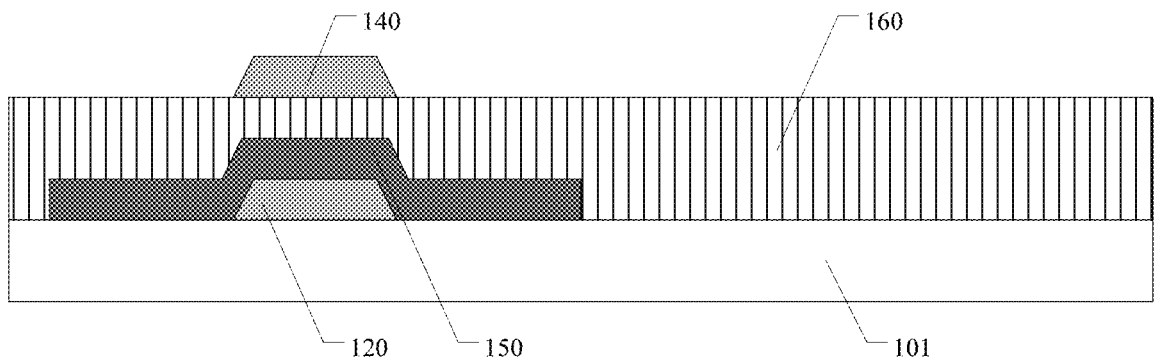
FIG. 4 is a schematic structural diagram of another electronic device provided by one embodiment of the present disclosure.

For example, the manufacturing method of the electronic device, provided by one example of the embodiment, further comprises: as shown in FIG. 4, forming a conductive structure 140 on the insulating protective layer 160. The conductive structure 140 and the metallic structure 120 have an overlapped part. The dielectric constant of the oxygen-free insulating layer 150 is less than or equal to 6. The oxygen-free insulating layer 150 and the insulating protective layer 160 are formed between the conductive structure 140 and the metallic structure 120. As the conductive structure 140 and the metallic structure 120 have an overlapped part, parasitic capacitance may be formed between the conductive structure 140 and the metallic structure 120, so as to affect the normal use of the electronic device. However, as the dielectric constant of the oxygen-free insulating layer 150 is less than or equal to 6 and less than the dielectric constant of the insulating protective layer 160, compared with an insulating protective layer having the same thickness with the sum of the thickness of the oxygen-free insulating layer 150 and the insulating protective layer 160, the embodiment can reduce the parasitic capacitance between the conductive structure 140 and the metallic structure 120, and hence achieve the objective of improving the signal stability.

For example, the oxygen-free insulating layer may be made from materials of which the dielectric constant is less than or equal to 6, e.g., SiNC or SiNF.

Figure 5:
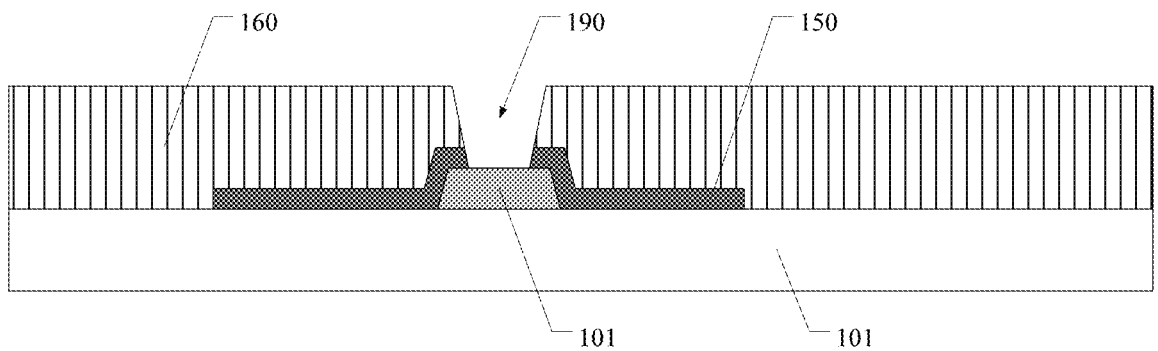
FIG. 5 is a schematic structural diagram of another electronic device provided by one embodiment of the present disclosure.

For example, the manufacturing method of the electronic device, provided by one example of the embodiment, further comprises: as shown in FIG. 5, forming through holes 190 in the oxygen-free insulating layer 150 and the insulating protective layer 160. The through holes 190 are used for exposing the metallic structure 120. The insulating protective layer 150 is etched by oxygen etching process. The oxygen-free insulating layer 160 is etched by oxygen-free etching process, so as to form the through holes 190.

In the manufacturing method of the electronic device, provided by the embodiment, in the process of forming the through holes 190 in the oxygen-free insulating layer 150 and the insulating protective layer 160, the oxygen-free insulating layer 160 is etched by the oxygen-free etching process, so as to avoid the metallic structure 120 from making contact with oxygen in the etching process and hence avoid the metallic structure 120 from being oxidized; and meanwhile, as the oxygen etching process usually has a rapid etching speed, the etching of the insulating protective layer 160 by the oxygen etching process can improve the overall etching speed for etching the oxygen-free insulating layer 150 and the insulating protective layer 160.

For example, in the manufacturing method of the electronic device, provided by one example of the embodiment, under the oxygen-free etching process, the etching rate of the oxygen-free insulating layer is larger than the etching rate of the insulating protective layer. For example, the oxygen-free insulating layer may be made from materials with rapid etching speed under oxygen-free etching process, e.g., SiNC or SiNF. Thus, the overall etching speed for etching the oxygen-free insulating layer and the insulating protective layer can be further improved.

For example, in the manufacturing method of the electronic device, provided by one example of the embodiment, as shown in FIG. 5, the thickness of the oxygen-free insulating layer 150 is less than the thickness of the insulating protective layer 160. Thus, in the process of etching the oxygen-free insulating layer 160 by the oxygen-free etching process, even the oxygen-free etching process has slow etching speed, as the thickness of the oxygen-free insulating layer 150 is less than the thickness of the insulating protective layer 160, the influence of the oxygen-free etching process on the etching of the oxygen-free insulating layer 160 can be reduced, so that the overall etching speed for etching the oxygen-free insulating layer and the insulating protective layer can be further improved.

For example, in the manufacturing method of the electronic device, provided by one example of the embodiment, a dry etching process is adopted to etch the through holes. Of course, the embodiment includes but not limited thereto.

For example, in the manufacturing method of the electronic device, provided by one example of the embodiment, the metallic structure may include at least one of a gate electrode, a gate line, a data line, a source electrode, a drain electrode, a common electrode lines or a common electrode; and the insulating protective layer includes at least one of an interlayer dielectric layer or a passivation layer. Thus, the manufacturing method of the electronic device, provided by the embodiment, may be adopted to protect the gate electrodes, the gate line, the data line, the source electrode, the drain electrode, the common electrode line and the common electrode, and prevent the gate electrode, the gate line, the data line, the source electrode, the drain electrode, the common electrode line and the common electrode from being oxidized.

For example, in the manufacturing method of the electronic device, provided by one example of the embodiment, the semiconductors may include active layers. Thus, the manufacturing method of the electronic device, provided by the embodiment, may be adopted to simultaneously change a part of the active layer into a conductor in the process of forming the oxygen-free insulating layer.

Second Embodiment

Figure 6:
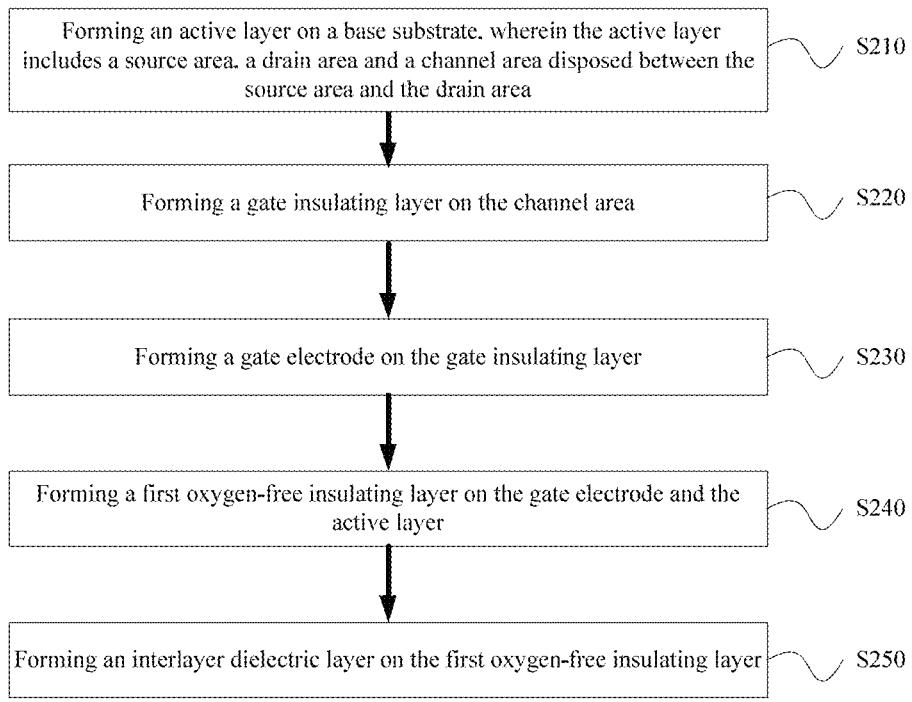
FIG. 6 is a flow diagram of a manufacturing method of a thin film transistor, provided by one embodiment of the present disclosure.

The embodiment provides a manufacturing method of a thin film transistor. As illustrated in FIG. 6, the manufacturing method of the thin film transistor comprises the steps S210-S250.

Figure 7:
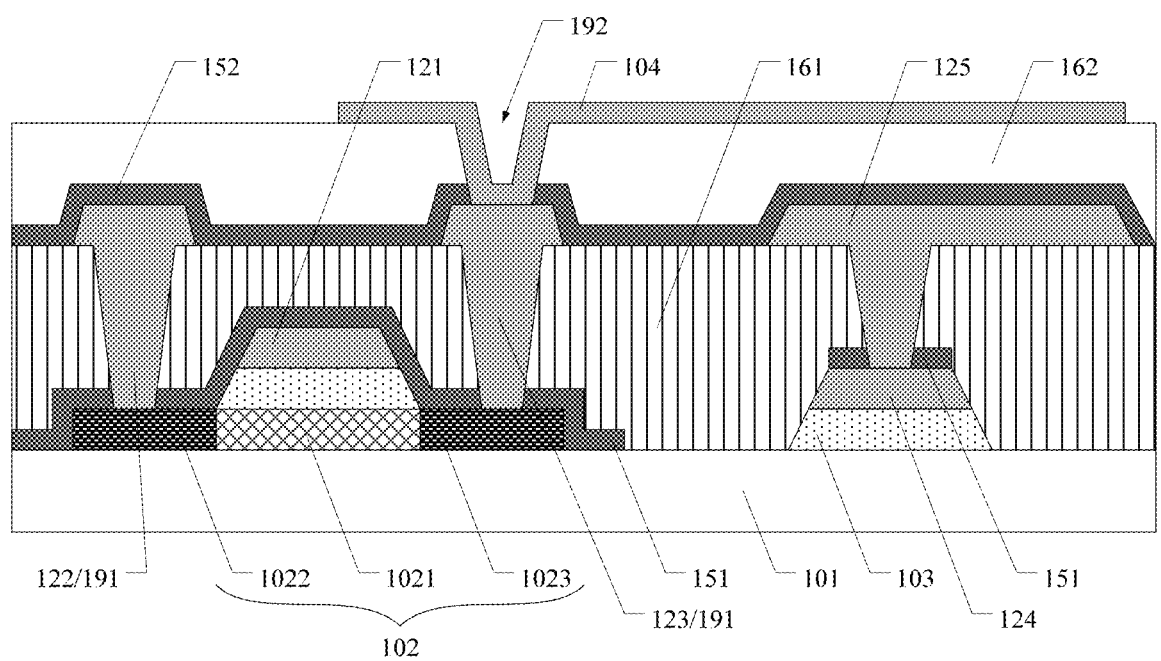
FIG. 7 is a schematic structural diagram of an array substrate provided by one embodiment of the present disclosure.

S210: as shown in FIG. 7, forming an active layer 102 on a base substrate 101, wherein the active layer 102 includes a source area 1022, a drain area 1023 and a channel area 1021 located between the source area 1022 and the drain area 1023.

For example, the material of the active layer 102 may include oxide semiconductor. Of course, the present embodiment includes but is not limited thereto. The material of the active layer 102 may also include other semiconductor materials such as amorphous silicon (a-Si) and poly-Si.

S220: as shown in FIG. 7, forming a gate insulating layer 103 on the channel area 1021.

S230: as shown in FIG. 7, forming a gate electrode 121 on the gate insulating layer 103.

S240: as shown in FIG. 7, forming a first oxygen-free insulating layer 151 on the gate electrode 121 and the active layer 102.

S250: as shown in FIG. 7, forming an interlayer dielectric layer 161 on the first oxygen-free insulating layer 151.

In the manufacturing method of the TFT, provided by the embodiment, as the first oxygen-free insulating layer is formed on the gate electrode, the first oxygen-free insulating layer may protect the gate electrode and prevent the gate electrode from being oxidized when the interlayer dielectric layer is formed. In addition, due to the protection of the first oxygen-free insulating layer, the interlayer dielectric layer may be formed by high deposition temperature, so that the TFT characteristics and the stability of the thin film transistor manufactured by the manufacturing method of the thin film transistor, provided by the embodiment, can be improved. Moreover, as the first oxygen-free insulating layer does not contain oxygen elements, in the long-term use process of the thin film transistor manufactured by the manufacturing method of the thin film transistor, provided by the embodiment, no oxygen element in the first oxygen-free insulating layer is penetrated into the gate electrode, so as to avoid the gate electrode from being oxidized and hence further improve the stability of the thin film transistor.

For example, in the manufacturing method of the thin film transistor, provided by one example of the embodiment, the first oxygen-free insulating layer is made from silane; and the manufacturing method of the TFT further comprises: changing the source area and the drain area of the active layer into conductor in the process of forming the first oxygen-free insulating layer.

In the manufacturing method of the thin film transistor, provided by the embodiment, the source area and the drain area of the active layer may be changed into conductor upon the first oxygen-free insulating layer being made from silane, so that the steps can be simplified and the cost can be reduced.

For example, as shown in FIG. 7, the manufacturing method of the thin film transistor, provided by one example of the embodiment, further comprises: forming first through holes 191 for respectively exposing the source area 1022 and the drain area 1023 in the interlayer dielectric layer 161 and the first oxygen-free insulating layer 151; forming a source electrode 122 and a drain electrode 123 on the interlayer dielectric layer 161, in which the source electrode 122 and the drain electrode 123 are respectively electrically connected with the source area 1022 and the drain area 1023 via the first through holes 191; forming a second oxygen-free insulating layer 152 on the source electrode 122 and the drain electrode 123; and forming a passivation layer 162 on the second oxygen-free insulating layer 152.

In the manufacturing method of the thin film transistor, provided by the embodiment, the second oxygen-free insulating layer formed on the source electrode and the drain electrode may protect the source electrode and the drain electrode and prevent the source electrode and the drain electrode from being oxidized. In addition, due to the protection of the second oxygen-free insulating layer, the passivation layer may be formed by high deposition temperature, so that the TFT characteristics and the stability of the thin film transistor manufactured by the manufacturing method of the thin film transistor, provided by the embodiment, can be improved. Moreover, as the second oxygen-free insulating layer does not contain oxygen elements, in the long-term use process of the thin film transistor manufactured by the manufacturing method of the thin film transistor, provided by the embodiment, no oxygen element in the second oxygen-free insulating layer is penetrated into the source electrode and the drain electrode, so as to avoid the source electrode and the drain electrode from being oxidized and hence further improve the stability of the thin film transistor.

For example, as shown in FIG. 7, the thickness of the first oxygen-free insulating layer 151 is less than the thickness of the interlayer dielectric layer 161.

For example, as shown in FIG. 7, the manufacturing method of the thin film transistor, provided by one example of the embodiment, further comprises: forming a second through hole 192 for exposing the drain electrode 123 in the second oxygen-free insulating layer 152 and the passivation layer 162, in which the passivation layer 162 may be etched by oxygen etching process; and the second oxygen-free insulating protective layer 152 may be etched by oxygen-free etching process.

In the manufacturing method of the thin film transistor, provided by the embodiment, the etching of the second oxygen-free insulating layer by the oxygen-free etching process can prevent the drain electrode from making contact with oxygen in the etching process and hence avoid the drain electrode from being oxidized; and meanwhile, as the oxygen etching process usually has rapid etching speed, the etching of the passivation layer by the oxygen etching process can improve the overall etching speed for etching the second oxygen-free insulating layer and the passivation layer.

For example, in the manufacturing method of the thin film transistor, provided by one example of the embodiment, under the oxygen-free etching process, the etching rate of the second oxygen-free insulating layer is larger than the etching rate of the passivation layer. For example, the second oxygen-free insulating layer may be made from materials with rapid etching rate under the oxygen-free etching process, e.g., SiNC or SiNF. Thus, the overall etching speed for etching the second oxygen-free insulating layer and the passivation layer can be further improved.

For example, in the manufacturing method of the thin film transistor, provided by one example of the embodiment, as shown in FIG. 7, the thickness of the second oxygen-free insulating layer 152 is less than the thickness of the passivation layer 162. Thus, in the process of etching the second oxygen-free insulating layer 152 by the oxygen-free etching process, even the oxygen-free etching process has slow etching speed, as the thickness of the second oxygen-free insulating layer 152 is less than the thickness of the passivation layer 162, the influence of the oxygen-free etching process on the etching of the second oxygen-free insulating layer 152 can be reduced, so that the overall etching speed for etching the second oxygen-free insulating layer and the passivation layer can be further improved.

For example, in the manufacturing method of the thin film transistor, provided by one example of the embodiment, at least one of the gate electrode, the source electrode or the drain electrode includes copper, so that signal delay can be reduced, and hence the display quality can be improved. In a large-size display device, the effect is more obvious. Of course, the present embodiment includes but is not limited thereto. The materials of the gate electrode, the source electrode and the drain electrode may also include other conductive materials.

For example, in the manufacturing method of the thin film transistor, provided by one example of the embodiment, the materials of the first oxygen-free insulating layer or the second oxygen-free insulating layer include SiNC or SiNF. Of course, the present embodiment includes but is not limited thereto. In addition, the materials of the first oxygen-free insulating layer and the materials of the second oxygen-free insulating layer may be the same or different.

Description is given in the manufacturing method of the TFT, provided by the embodiment by taking a top-gate TFT as an example. The top-gate TFT can greatly reduce the parasitic capacitance and has wide application prospect in the aspect of large-size, high-refresh-rate and high-resolution display application. Of course, the embodiment includes but not limited thereto. The manufacturing method of the TFT, provided by the embodiment, may be used for manufacturing a bottom-gate TFT by simple conversion. No further description will be given here.

Third Embodiment

The embodiment provides a manufacturing method of an array substrate. The manufacturing method of the array substrate comprises: forming a thin film transistor, wherein the thin film transistor may be manufactured by any method provided by the second embodiment. The manufacturing method of the array substrate, provided by the embodiment, also has the technical effects of the manufacturing method of the thin film transistor, provided by the second embodiment, due to adoption of the manufacturing method of the thin film transistor provided by the second embodiment. The repeated portions will be omitted herein.

Figure 8:
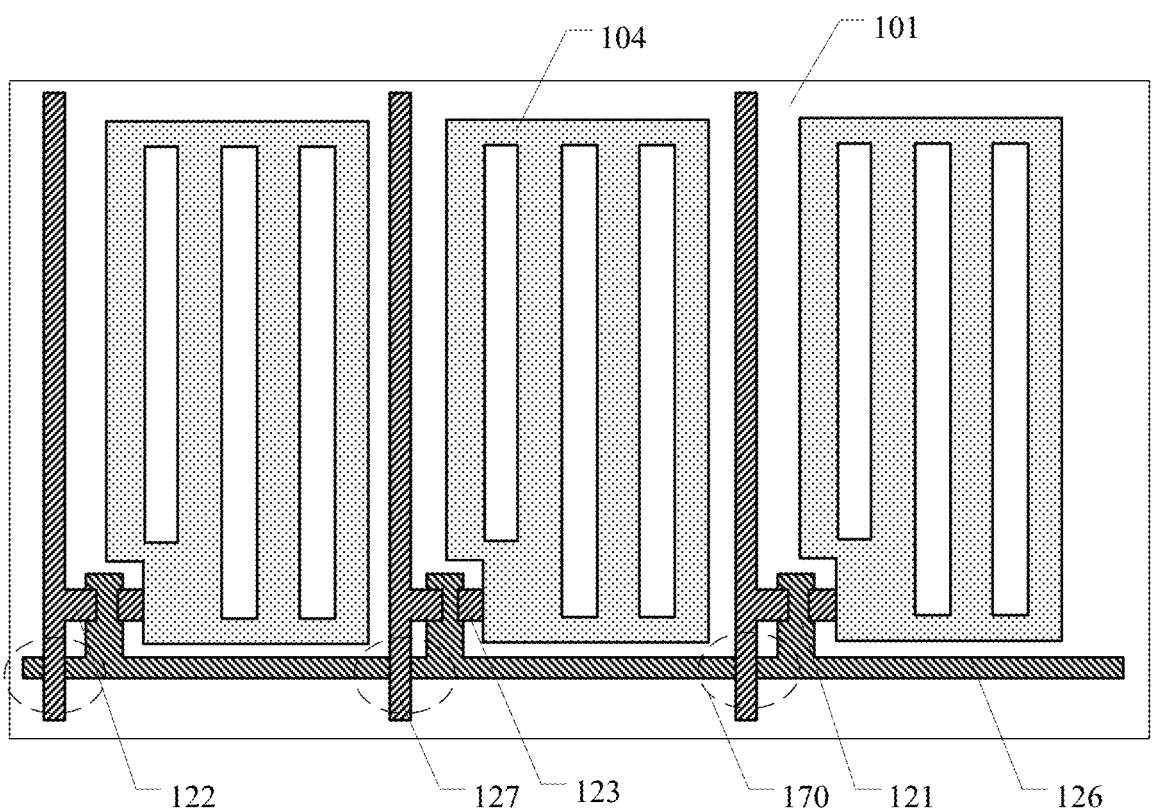
FIG. 8 is a schematic plan diagram of the array substrate provided by one embodiment of the present disclosure.

For example, as shown in FIG. 8, the manufacturing method of the array substrate, provided by one example of the embodiment, further comprises: forming a gate line 126 and a data line 127 on the base substrate 101, in which the gate line 126 and the gate electrode 121 are arranged in the same layer; and the data line 127 and the source electrode 122 and the drain electrode 123 are arranged in the same layer. For example, the gate line 126 and the gate electrode 121 may be formed by the same patterning process; and the data line 127 and the source electrode 122 and the drain electrode 123 may be formed by the same patterning process. The gate line 126 and the data line 127 have an overlapped part 170 (positions as shown by dotted lines in the figure). The dielectric constant of the first oxygen-free insulating layer is less than or equal to 6.

In the manufacturing method of the array substrate, provided by the embodiment, a first oxygen-free insulating layer and an interlayer dielectric layer are formed between the gate line 126 and the data line 127 at positions at which the gate line 126 and the data line 127 are overlapped. As the gate line 126 and the data line 127 have an overlapped part 170, parasitic capacitance may be formed between the gate line 126 and the data line 127, so as to affect the normal use of the array substrate. However, as the dielectric constant of the first oxygen-free insulating layer is less than or equal to 6 and less than the dielectric constant of the interlayer dielectric layer, compared with an interlayer dielectric layer having the same thickness with the sum of the thickness of the first oxygen-free insulating layer and the interlayer dielectric layer, the embodiment can reduce the parasitic capacitance between the gate line 126 and the data line 127, and hence achieve the objective of improving the signal stability.

For example, in the manufacturing method of the array substrate, provided by one example of the embodiment, the first oxygen-free insulating layer may be made from materials of which the dielectric constant is less than or equal to 6, e.g., SiNC or SiNF.

For example, as shown in FIG. 7, the manufacturing method of the array substrate, provided by one example of the embodiment, further comprises: forming a common electrode line 124 on the base substrate 101. The common electrode line 124 may be formed in the same layer with the gate electrode 121. When the first oxygen-free insulating layer 151 is formed on the gate electrode 121 and the active layer 102, the first oxygen-free insulating layer 151 may also be formed on the common electrode line 124, so as to protect the common electrode line 124 and prevent the common electrode line 124 from being oxidized.

For example, as shown in FIG. 7, the manufacturing method of the array substrate, provided by one example of the embodiment, further comprises: forming a common electrode 125 on the interlayer dielectric layer. The common electrode 125 may be formed in the same layer with the source electrode 122 and the drain electrode 123. Upon the second oxygen-free insulating layer 152 being formed on the source electrode 122 and the drain electrode 123, the second oxygen-free insulating layer 152 may also be formed on the common electrode 125, so as to protect the common electrode 125.

For example, as shown in FIG. 7, the manufacturing method of the array substrate, provided by one example of the embodiment, further comprises: forming a pixel electrode 104 on the passivation layer 162. The pixel electrode 104 is connected with the drain electrode 123 via the second through hole 192. The pixel electrode 104 and common electrode 125 may produce electric fields to control liquid crystals, so as to display an image.

Fourth Embodiment

The embodiment provides an electronic device. As illustrated in FIG. 2, the electronic device comprises: a base substrate 101; a metallic structure 120 disposed on the base substrate 101; an oxygen-free insulating layer 150 disposed on the metallic structure 120; and an insulating protective layer 160 disposed on the oxygen-free insulating layer 150.

In the electronic device provided by the embodiment, the oxygen-free insulating layer 150 may protect the metallic structure 120 and prevent the metallic structure 120 from being oxidized. In addition, as the insulating protective layer 160 may be formed by a high deposition temperature, the electrical properties and the stability of the electronic device can be improved. Moreover, as the oxygen-free insulating layer 150 does not contain oxygen elements, in the long-term use process of the electronic device, no oxygen element in the oxygen-free insulating layer 150 is penetrated into the metallic structure 120, so that the metallic structure 120 can be prevented from being oxidized, and hence the stability of the electronic device can be further improved.

For example, in the electronic device provided by one example of the embodiment, as shown in FIG. 2, the oxygen-free insulating layer 150 makes direct contact with the metallic structure 120.

For example, in the electronic device provided by one embodiment of the present disclosure, as shown in FIG. 2, the material of the metallic structure 120 include copper; and the electronic device further comprises a diffusion barrier layer 110 disposed beneath the metallic structure 120. As copper has low resistivity, the adoption of copper as the materials of the metallic structure 120 can reduce signal delay and hence improve the display quality. In a large-size display device, the effect is more obvious. Of course, the present embodiment includes but is not limited thereto. The material of the metallic structure 120 may also include other conductive materials. In addition, the diffusion barrier layer 110 disposed beneath the metallic structure 120 can prevent copper elements of the metallic structure 120 from being diffused to other structures.

For example, in the electronic device provided by one example of the embodiment, as shown in FIG. 3, semiconductor layer 102 are disposed below the metallic structure 120; the oxygen-free insulating layer 150 makes contact with a part of the semiconductor layer 102; the part of the semiconductor layer 102 making contact with the oxygen-free insulating layer 150 include a conductive part 1020; the oxygen-free insulating layer 150 is made from silane; and the conductive part 1020 is changed into conductor by hydrogen released by silane. Thus, the part of the semiconductor layer 102 making contact with the oxygen-free insulating layer 150 can be changed into conductor upon the oxygen-free insulating layer 150 being formed, so that the steps can be simplified and the cost can be reduced.

For example, as shown in FIG. 4, the electronic device provided by one example of the embodiment further comprises: a conductive structure 140 disposed on the insulating protective layer 160. The conductive structure 140 and the metallic structure 120 have an overlapped part. The dielectric constant of the materials of the oxygen-free insulating layer 150 is less than or equal to 6. The oxygen-free insulating layer 150 and the insulating protective layer 160 are disposed between the metallic structure 120 and the conductive structure 140. As the conductive structure 140 and the metallic structure 120 have an overlapped part, parasitic capacitance may be formed between the conductive structure 140 and the metallic structure 120, so as to affect the normal use of the electronic device. However, as the dielectric constant of the oxygen-free insulating layer 150 is less than or equal to 6 and less than the dielectric constant of the insulating protective layer 160, compared with an insulating protective layer having the same thickness with the sum of the thickness of the oxygen-free insulating layer 150 and the insulating protective layer 160, the embodiment can reduce the parasitic capacitance between the conductive structure 140 and the metallic structure 120, and hence achieve the objective of improving the signal stability.

For example, the oxygen-free insulating layer may be made from materials of which the dielectric constant is less than or equal to 6, e.g., SiNC or SiNF.

Fifth Embodiment

The embodiment provides an array substrate, which comprises any electronic device provided by the fourth embodiment. The array substrate provided by the embodiment also has the technical effects of the electronic device provided by the fourth embodiment due to adoption of the electronic device provided by the fourth embodiment. The repeated portions will be omitted herein.

The following points should be noted:

(1) The accompanying drawings of the embodiments of the present disclosure only involve the structures relevant to the embodiments of the present disclosure, and other structures may refer to the prior art.

(2) For clarity, in the accompanying drawings of the embodiments of the present disclosure, the thickness and the dimension of layers or microstructures are enlarged. It should be understood that: when an element such as a layer, a film, a region or a substrate is referred to as being disposed "on" or "beneath" another element, the element may be "directly" disposed "on" or "beneath" another element, or an intermediate element may be provided.

(3) The technical features in the same embodiment and different embodiments may be mutually combined without conflict.

The foregoing is only the preferred embodiments of the present disclosure and not intended to limit the scope of protection of the present disclosure. The scope of protection of the present disclosure should be defined by the appended claims.

The application claims priority to the Chinese patent application No. 201610365811.0, filed May 27, 2016, the disclosure of which is incorporated herein by reference as part of the application.

The invention claimed is:

1. A manufacturing method of an electronic device, comprising:
   forming a metallic structure on a base substrate;
   forming an oxygen-free insulating layer on the metallic structure and the base substrate; and
   forming an insulating protective layer on the oxygen-free insulating layer,
   wherein the oxygen-free insulating layer is made from silane; and the manufacturing method of the electronic device further comprises:
   forming a semiconductor layer on a side of the metallic structure away from the oxygen-free insulating layer; and
   changing a part of the semiconductor layer making contact with the oxygen-free insulating layer into a conductor by hydrogen released from the silane in the process of forming the oxygen-free insulating layer.

2. The manufacturing method of the electronic device according to claim 1, further comprising:
   forming a conductive structure on the insulating protective layer, wherein the conductive structure and the metallic structure have an overlapped part; and the dielectric constant of the oxygen-free insulating layer is less than or equal to 6.

3. The manufacturing method of the electronic device according to any one of claims 1, further comprising:
   forming through holes in the oxygen-free insulating layer and the insulating protective layer, wherein the through holes are used for exposing the metallic structure; the insulating protective layer is etched by an oxygen etching process; and the oxygen-free insulating layer is etched by an oxygen-free etching process, so as to form the through holes.

4. The manufacturing method of the electronic device according to claim 3, wherein under the oxygen-free etching process, an etching rate of the oxygen-free insulating layer is larger than that of the insulating protective layer.

5. The manufacturing method of the electronic device according to any one of claims 1, wherein the metallic structure includes at least one of a gate electrode, a gate line, a data line, a source electrode, a drain electrode, a common electrode line or a common electrode; and the insulating protective layer includes at least one of an interlayer dielectric layer or a passivation layer.

6. The manufacturing method of the electronic device according to claim 5, wherein the metallic structure has a material including copper; and the manufacturing method of the electronic device further comprises:
   forming a diffusion barrier layer beneath the metallic structure.

7. The manufacturing method of the electronic device according to any one of claims 1, wherein a thickness of the oxygen-free insulating layer is less than that of the insulating protective layer.

8. A manufacturing method of a thin film transistor (TFT), comprising:
   forming an active layer on a base substrate, wherein the active layer includes a source area, a drain area and a channel area disposed between the source area and the drain area;
   forming a gate insulating layer on the channel area;
   forming a gate electrode on the gate insulating layer;
   forming a first oxygen-free insulating layer on the gate electrode and the active layer; and
   forming an interlayer dielectric layer on the first oxygen-free insulating layer,
   wherein the first oxygen-free insulating layer is made from silane; and the manufacturing method of the TFT further comprises: changing the source area and the drain area of the active layer into a conductor by hydrogen released by the silane in the process of forming the first oxygen-free insulating layer.

9. The manufacturing method of the TFT according to claim 8, further comprising:
   forming first through holes for respectively exposing the source area and the drain area in the interlayer dielectric layer and the first oxygen-free insulating layer;
   forming a source electrode and a drain electrode on the interlayer dielectric layer, wherein the source electrode and the drain electrode are respectively electrically connected with the source area and the drain area via the first through holes;
   forming a second oxygen-free insulating layer on the source electrode and the drain electrode; and
   forming a passivation layer on the second oxygen-free insulating layer.

10. The manufacturing method of the TFT according to claim 9, further comprising:
    forming a second through hole for exposing the drain electrode in the second oxygen-free insulating layer and the passivation layer, wherein the passivation layer is etched by an oxygen etching process; and the second oxygen-free insulating layer is etched by an oxygen-free etching process.

11. The manufacturing method of the TFT according to claim 10, wherein under the oxygen-free etching process, an etching rate of the second oxygen-free insulating layer is larger than that of the passivation layer.

12. The manufacturing method of the TFT according to claim 11, wherein at least one of the gate electrode, the source electrode or the drain electrode include copper.

13. A manufacturing method of an array substrate, comprising forming TFTs, wherein the TFTs are manufactured by the method according to claim 9.

14. The manufacturing method of the array substrate according to claim 13, further comprising:
  forming a gate line and a data line on the base substrate, wherein the gate line and the gate electrode are arranged in a same layer; the data line and the source electrode and the drain electrode are arranged in a same layer; the gate line and the data line have an overlapped part; and the dielectric constant of the first oxygen-free insulating layer is less than or equal to 6.

* * * * *